United States Patent
Dwilinski et al.

(10) Patent No.: US 7,315,559 B2
(45) Date of Patent: Jan. 1, 2008

(54) NITRIDE SEMICONDUCTOR LASER DEVICE AND A METHOD FOR IMPROVING ITS PERFORMANCE

(75) Inventors: Robert Dwilinski, Warsaw (PL); Roman Doradziński, Warsaw (PL); Jerzy Garczyński, Lomianki (PL); Leszek P. Sierzputowski, Union, NJ (US); Yasuo Kanbara, Anan (JP)

(73) Assignee: Ammono Sp. z o.o., Warszawa (PL)

( * ) Notice: Subject to any disclaimer, the term of this patent is extended or adjusted under 35 U.S.C. 154(b) by 205 days.

(21) Appl. No.: 10/519,501

(22) PCT Filed: Jun. 26, 2003

(86) PCT No.: PCT/PL03/00061

§ 371 (c)(1),
(2), (4) Date: Dec. 27, 2004

(87) PCT Pub. No.: WO2004/004085

PCT Pub. Date: Jan. 8, 2004

(65) Prior Publication Data

US 2005/0249255 A1 Nov. 10, 2005

(30) Foreign Application Priority Data

Jun. 26, 2002 (PL) .................................. 354739
Jun. 26, 2002 (PL) .................................. 354740

(51) Int. Cl.
*H01S 5/00* (2006.01)
(52) U.S. Cl. ................... 372/49.01; 372/43.01
(58) Field of Classification Search ............ 372/43.01
See application file for complete search history.

(56) References Cited

U.S. PATENT DOCUMENTS

| 6,249,534 | B1 | 6/2001 | Itoh et al. |
| 2005/0056824 | A1* | 3/2005 | Bergmann et al. ............ 257/14 |
| 2005/0167836 | A1* | 8/2005 | Tomiya et al. .............. 257/744 |

FOREIGN PATENT DOCUMENTS

| EP | 0 949 731 A | 10/1999 |
| FR | 2 796 657 A | 1/2001 |

(Continued)

OTHER PUBLICATIONS

Douglas R. Ketchum et al., "Crystal Growth of Gallium Nitride in Supercritical Ammonia", Journal of Crystal Growth, Jan. 2001, pp. 431-434, vol. 222, Elsevier Science B.V.

*Primary Examiner*—Dung T Nguyen
(74) *Attorney, Agent, or Firm*—Smith Patent Office

(57) ABSTRACT

The present invention relates to a nitride semiconductor laser device provided with a window layer on a light-emitting end face of the resonator which comprises an active layer of nitride semiconductor between the n-type nitride semiconductor layers and the p-type nitride semiconductor layers, in which at least the radiation-emitting end face of said resonator is covered by said window layer comprising monocrystalline nitride of general formula $Al_xGa_{1-x-y}In_yN$, where $0 \leq x+y \leq 1$, $0 \leq x \leq 1$ and $0 \leq y < 1$, having a wider energy gap than that of the active layer and being formed at a low temperature so as not to damage said active layer. Formation of such a window layer improves significantly the performance of the nitride laser device according to the invention.

10 Claims, 6 Drawing Sheets

FOREIGN PATENT DOCUMENTS

| | | |
|---|---|---|
| JP | 2-137287 A | 5/1990 |
| JP | 7-249830 A | 9/1995 |
| JP | 2000-82863 A | 3/2000 |
| JP | 2002-26442 A | 1/2002 |

\* cited by examiner

Fig. 1
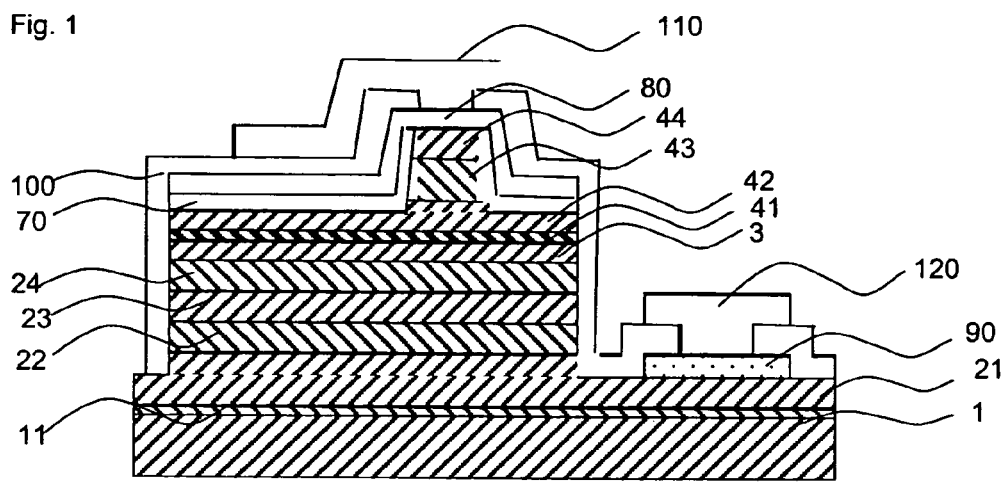
Fig. 2-A
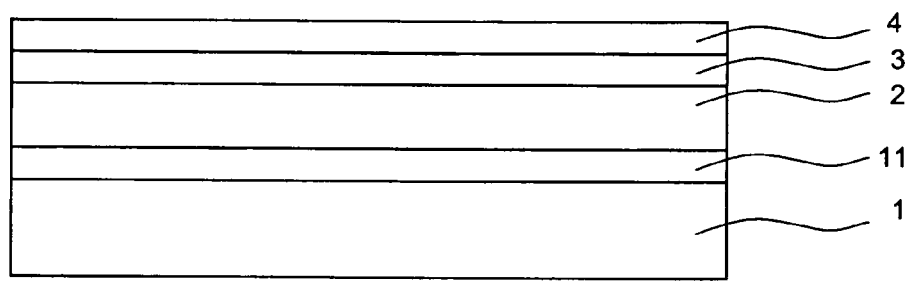
Fig. 2-B
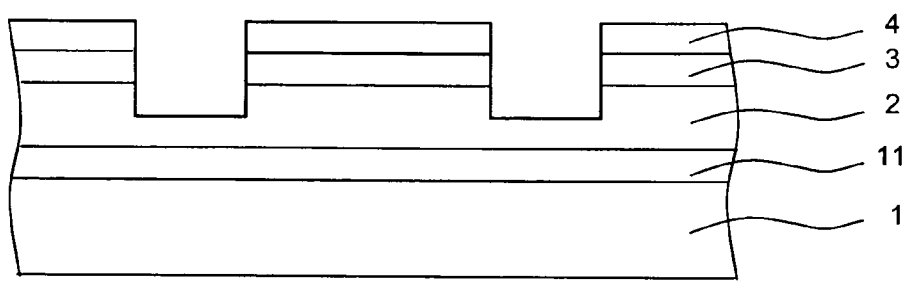
Fig. 2-C
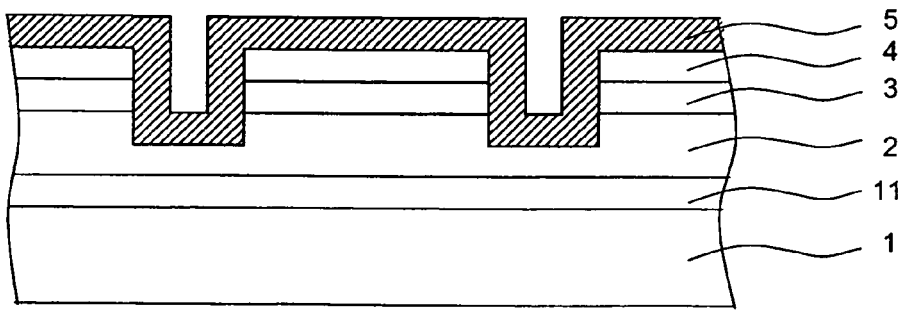

Fig. 9
Fig. 9-A
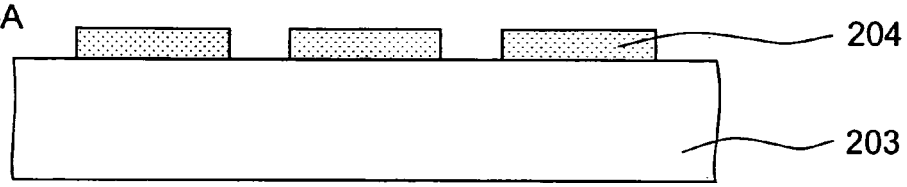
Fig. 9-B
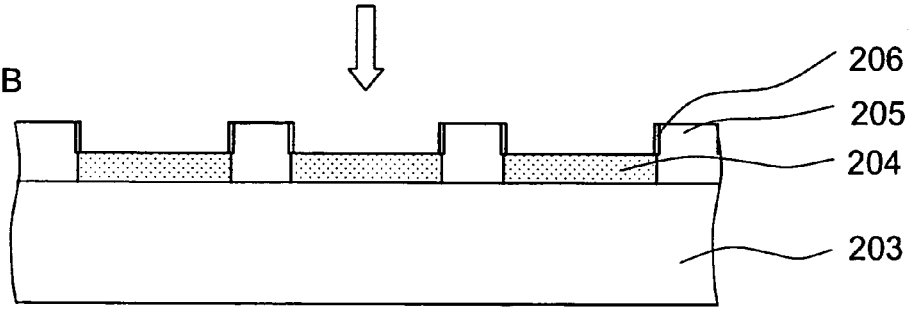
Fig. 9-C
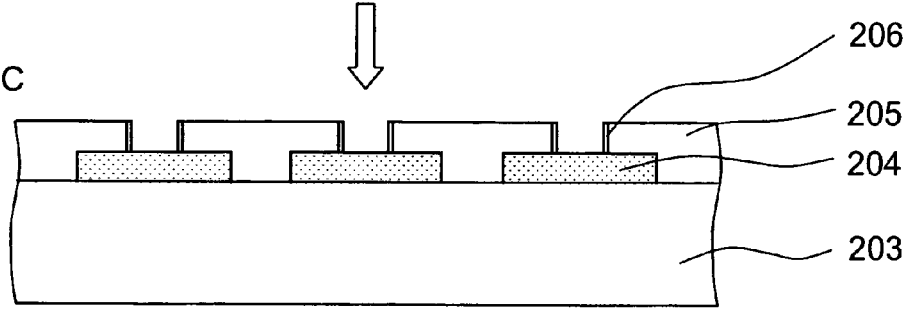
Fig. 9-D
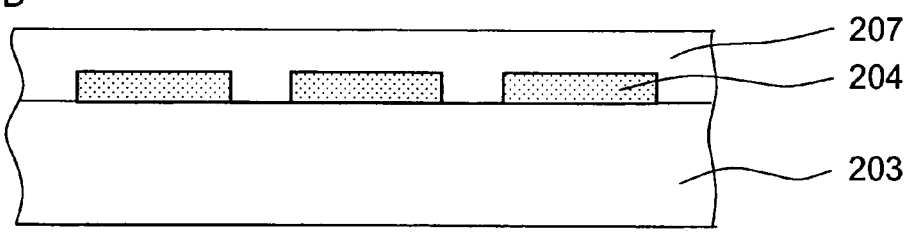

Fig. 10
Fig. 10-A
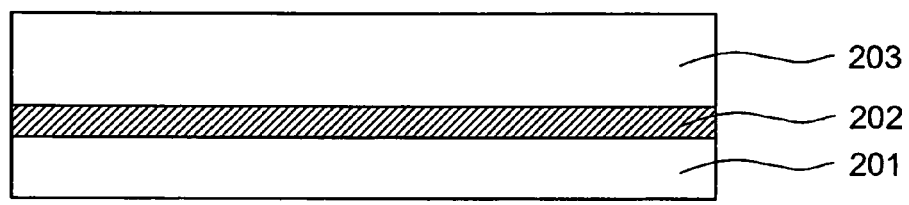
Fig. 10-B
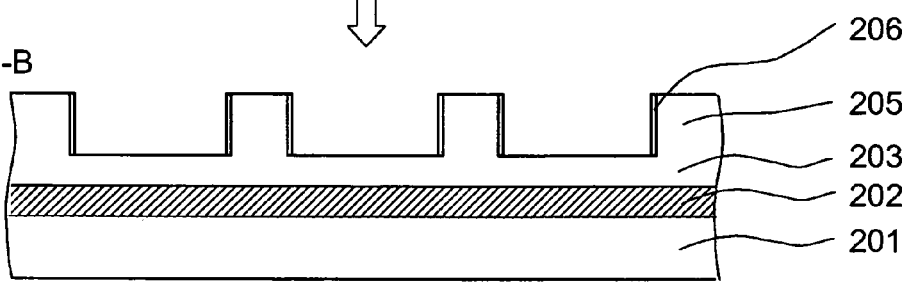
Fig. 10-C
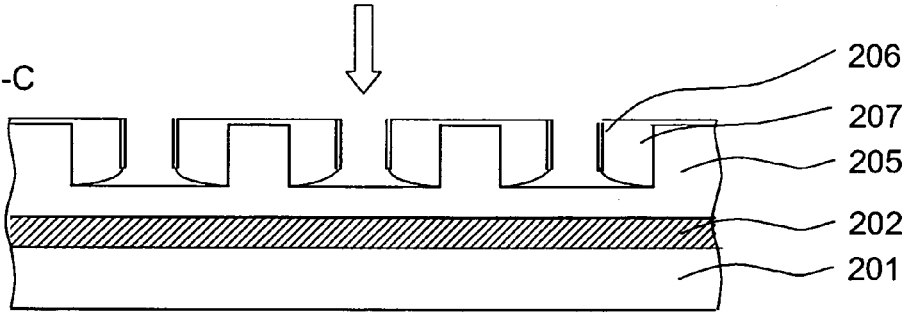
Fig. 10-D
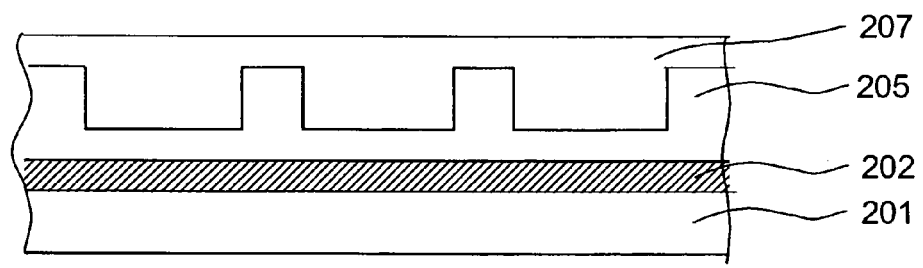

NITRIDE SEMICONDUCTOR LASER DEVICE AND A METHOD FOR IMPROVING ITS PERFORMANCE

BACKGROUND OF THE INVENTION

1. Field of the Invention

The invention relates to a nitride semiconductor laser device and to a method for improving its performance leading to an extension of its lifetime. In particular the method according to the invention relates to providing a window layer on the radiation emitting end face of the resonator. Such a layer increases durability of the nitride semiconductor laser device according to the invention.

2. Description of the Related Art

Lifetime of semiconductor laser devices depends primarily on quality of the optically active layers, and especially on quality of resonator mirrors of such layers. In the so-far used semiconductor laser diodes manufactured on the basis of semiconductors of the GaAs group, extension of the lifetime of a laser diode is achieved by forming special layers on resonator mirrors. These layers are used as anti-reflection layers or they form a window structure. Such a structure has been disclosed in Japanese patent application number 10-251577 published under a publication number 2000-082863.

The energy gap in a semiconductor window layers has to be wider than that in the active layer of semiconductor laser structures in order to increase durability of thus protected laser structures.

In nitride semiconductor lasers, resonator mirrors are obtained as a result of Reactive Ion Etching (RIE) or cleavage, and—due to energy gap narrowing—they absorb emitted radiation, which results in heat generation leading to impairment of the lifetime of over 100 mW laser diodes. Therefore, it was suggested that a window structure in nitride semiconductor lasers should be obtained by covering resonator end faces with the AlGaInN semiconductor layer (Japanese unexamined patent publication no. 249830/1995) or with a different layer, such as the AlN layer (Japanese unexamined patent publication no. 26442/2002).

According to the prior art technology, it is necessary to apply temperatures higher than 1000° C. to form the window layer made of monocrystalline gallium-containing nitride using growth methods from the gaseous phase, for example by the most commonly used Metallo-Organic Chemical Vapor Deposition (MOCVD) method. However, such high temperatures cause damage to the active layer formed of an indium-containing nitride semiconductor as used in nitride semiconductor lasers so far. On the other hand, when a nitride layer is formed by the currently known methods at temperature not causing damage to the active layer, the layer thus formed is amorphous. If the amorphous layer is used for forming a window structure, it brings about scattering of emitted light, due to which a laser beam becomes non-homogenous. Moreover, as a result of tinge caused by amorphousness, light absorption and end face heating occur, which consequently leads to accelerated degradation thereof.

Secondly, known nitride-based opto-electronic devices are manufactured on sapphire or silicon-carbide substrates, differing from the thereafter deposited nitride layers (heteroepitaxy). There are significant differences in chemical, physical, crystallographic and electrical properties of such substrates and semiconductor nitride layers deposited thereon by hetero-epitaxy, resulting in rather high dislocation density of the epitaxial semiconductor layers. In order to reduce surface dislocation density and thus to increase stability of the semiconductor laser structures, a buffer layer is first deposited on sapphire or SiC substrates. However, the reduction of surface dislocation density achieved is not higher than to about $10^8/cm^2$.

The surface dislocation density could be decreased thus far by using the Epitaxial Lateral Overgrowth (ELOG) method. In this method, a GaN layer is first grown on the sapphire substrate, and then $SiO_2$ is deposited in the form of strips or grids. Next, such a substrate may be used for lateral GaN growing, reducing the defects density to about $10^6/cm^2$.

Even further improvement of the substrate for epitaxial formation of nitride semiconductor laser device was attained by a method of manufacturing a bulk monocrystalline layer of gallium-containing nitride disclosed in WO 02/101120.

BRIEF SUMMARY OF THE INVENTION

The object of this invention is to develop a nitride semiconductor laser with a resonator radiation-emitting end face covered with a nitride window layer without impairing laser performance parameters.

Another object of this invention is to develop a nitride semiconductor laser structure on a new substrate having low surface dislocation density, preferably lower than about $10^6/cm^2$.

A further object of the present invention is to provide a method for improving performance of nitride semiconductor laser device involving manufacturing a nitride laser with a satisfactory nitride window layer.

These objectives were achieved by development of the nitride semiconductor laser device and a method for improving performance of such laser according to the invention, based on employing nitrides of Group XIII elements (numbering of the Groups is given according to the IUPAC convention of 1989 throughout this application), preferably gallium-containing nitrides of general formula $Al_xGa_{1-x-y}In_yN$, where $0 \leq x+y \leq 1$, $0 \leq x \leq 1$ and $0 \leq y<1$, especially nitrides of general formula $Al_xGa_{1-x}N$, ($0 \leq x \leq 1$).

A nitride semiconductor laser device provided with a window layer on a light-emitting end face of the resonator which comprises an active layer of nitride semiconductor between the n-type nitride semiconductor layers and the p-type nitride semiconductor layers, according to the present invention is characterized in that:

at least the radiation-emitting end face of said resonator is covered by said window layer comprising monocrystalline nitride of general formula $Al_xGa_{1-x-y}In_yN$, where $0 \leq x+y \leq 1$, $0 \leq x \leq 1$ and $0 \leq y<1$, especially nitride of general formula $Al_xGa_{1-x}N$, ($0 \leq x \leq 1$) having a wider energy gap than that of the active layer and being formed at a low temperature so as not to damage said active layer. In this invention, a term "window layer" denotes a layer having a wider energy gap than that of the active layer or the quantum well layer, which is formed directly on the radiation-emitting end face of resonator for avoiding the problems caused by the narrower energy gap of end face of the resonator.

A thickness of the end face window layer is preferably bigger than 50 Å, and is more preferably equal to integer multiplicity of the emitted radiation wave length ($n\lambda$).

According to the invention the end face window layer of monocrystalline $Al_xGa_{1-x}N$ ($0 \leq x \leq 1$) is preferably formed in the supercritical ammonia-containing solution.

Preferably, at least the p-type contact layer of the resonator is covered by a mask when the end face window layer of monocrystalline $Al_xGa_{1-x}N$, ($0 \leq x \leq 1$) is being formed in the supercritical ammonia-containing solution.

The resonator end face window layer contains at least one of the elements of Group I, preferably Li or Na.

Preferably, the resonator active layer has a structure of a (multi)quantum-well layer comprising at least one InGaN well layer or InAlGaN well layer.

According to the present invention the nitride semiconductor laser device structure is preferably formed on the substrate selected from the group consisting of GaN substrate, preferably monocrystalline GaN substrate, sapphire substrate, spinel substrate, ZnO substrate, SiC substrate, ELOG-type substrate and a substrate provided with a nitride semiconductor having a concavo-convex face. In this invention, the term "ELOG-type substrate" denotes a substrate provided with a nitride layer or layers made by means of so called ELOG (Epitaxial lateral overgrowth) method.

Preferably, the nitride semiconductor laser device structure is formed on C-plane, A-plane or M-plane of monocrystalline GaN substrate.

The nitride semiconductor laser device structure is formed on C-plane of monocrystalline GaN substrate and the resonator end face window layer is grown on M-plane or A-plane.

The nitride semiconductor laser device structure may also be formed on A-plane of monocrystalline GaN substrate, and the window layer is formed on C-plane or M-plane of the resonator radiation-emitting end face.

Alternatively, the nitride semiconductor laser device structure is formed on M-plane of monocrystalline GaN substrate, and the window layer is formed on C-plane or A-plane of the resonator radiation-emitting end face.

The present invention relates also to a method for improving the performance of a nitride semiconductor laser device having a resonator including an active layer comprising nitride semiconductor between n-type nitride semiconductor layer and p-type nitride semiconductor layer, in which in a first process a laser device structure is etched or cleaved and a pair of the opposed resonator end faces are formed, characterized in that in a second process the resonator radiation-emitting end face is covered by a window layer of monocrystalline nitride of general formula $Al_xGa_{1-x-y}In_yN$, where $0 \leq x+y \leq 1$, $0 \leq x \leq 1$ and $0 \leq y < 1$, especially nitride of general formula $Al_xGa_{1-x}N$, ($0 \leq x \leq 1$), having a wider energy gap than that of the active layer, at low temperature so as not to damage said active layer.

According to the invention, during the second process the resonator end face window layer is preferably formed in supercritical ammonia-containing solution.

In the method for improving the performance of a nitride semiconductor laser device according to the present invention, during the second process the resonator end face window layer is formed after at least upper surface of resonator p-type contact layer is covered by a mask having higher or same chemical resistance than that of end face window layer material in supercritical ammonia-containing solution.

Preferably, the mask is selected from the group consisting of SiO, SiN, AlN and Ag.

In the method for improving the performance of a nitride semiconductor laser device according to the present invention the resonator end face window layer is formed by depositing monocrystalline nitride layer of the above described composition in the supercritical ammonia-containing solution at a temperature of 800° C. or less, preferably 600° C. or less.

The present invention advances a significant progress in nitride-based opto-electronics.

BRIEF DESCRIPTION OF THE DRAWINGS

The invention is illustrated on the enclosed drawing where

FIG. 1 shows a cross-section of the nitride semiconductor laser according to the invention.

FIG. 2 illustrates the successive stages of the method according to the invention.

FIGS. 9-11 show successive phases of forming the three exemplary types of substrates for forming nitride semiconductor laser device according to the invention having the monocrystalline nitride layer formed as a result of the lateral overgrowth.

DETAILED DESCRIPTION OF THE INVENTION

Figure 3:
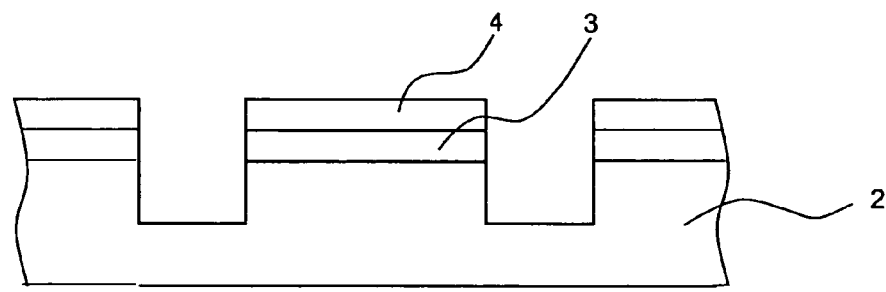
FIG. 3 shows a view of the nitride semiconductor laser structure according to the invention with all layers other than the nitride ones being removed.

In the present invention the following definitions apply.

Resonator active layer means a layer of the resonator, where the radiation is produced due to recombination of electricity carriers.

End face of the resonator means a boundary surface of the resonator, essentially perpendicular to the direction of the emitted light beam. The light is at least partially reflected from such a surface, because the index of refraction of monocrystalline nitrides, of which the resonator is formed, is higher than the index of refraction of the medium, in which the laser is placed (usually this is air or polymer). End faces of the resonator, with or without window layers, may be covered with reflection layers. Usually one of such reflection layers reflects much more light than the other one. In this case the radiation produced by the laser is emitted essentially in one direction, set by the reflection layer with lower reflectivity. Thus, we refer to the resonator end face corresponding to low reflectivity layer as to light or radiation-emitting end face, while the other end face is called light-reflecting end face.

Window layer means a layer having a wider energy gap than that of the active layer or the (multi)quantum well layer, which is formed directly on the light emitting end face of resonator for avoiding the problems caused by the narrower energy gap of the end face of the resonator. The thickness of the window layer is preferably equal to integer multiplicity of emitted radiation wavelength (nλ). A window layer may be additionally covered by a protective layer.

Gallium-containing nitride means a nitride of gallium and optionally other element(s) of group XIII. It includes, but is not restricted to, the binary compound GaN, ternary compounds such as AlGaN, InGaN and also AlInGaN, where the ratio of the other elements of group XIII to Ga can vary in a wide range.

C-, A- or M-plane refers to C-, A- or M-plane surfaces of hexagonal Group XIII element nitride crystals.

Supercritical ammonia-containing solvent means a fluid in a supercritical state, consisting essentially of ammonia and one or more Group I element ions, used to dissolve a gallium-containing feedstock.

The term supercritical solution is used when referring to the supercritical solvent when it contains Group XIII element(s), in particular gallium—in a soluble form originating from the dissolution of feedstock containing Group XIII element(s), in particular gallium.

Group XIII element(s)-complex compounds, in particular gallium-complex compounds are complex compounds, in which a Group XIII element(s), in particular gallium atom is a coordination center surrounded by ligands, such as $NH_3$ molecules or its derivatives, like $NH_2^-$, $NH^{2-}$, etc.

Autoclave means a closed container which has a reaction chamber where the ammonobasic process of formation of window layer is carried out in a method according to the invention.

In accordance with the invention, the monocrystalline nitride window layer made of nitride of the general formula $Al_xGa_{1-x-y}In_yN$, where $0 \leq x+y \leq 1$, $0 \leq x \leq 1$ and $0 \leq y < 1$, is formed in the environment of a supercritical ammonia-containing solution. Use of this technology allows to avoid the above problems known in prior art since the window layer formation temperature is low enough not to cause damage to the active layer of nitride semiconductor laser device.

In the case of an active layer made of the indium-containing nitride semiconductor, the formation temperature of that active layer is typically around 900° C. The indium-containing nitride decomposes at temperature ca. 950° C. Deposition of monocrystalline nitride layers by MOCVD or other gaseous phase epitaxial methods takes place at temperatures higher than 1000° C. Under such temperature regime indium-containing nitride active layer is damaged. Temperature of forming a monocrystalline layer of nitride of the general formula $Al_xGa_{1-x-y}In_yN$, where $0 \leq x+y \leq 1$, $0 \leq x \leq 1$ and $0 \leq y < 1$, in the environment of a supercritical ammonia-containing solution is lower than 800° C. and is typically lower than 600° C., preferably it is lower than 550° C. in the case of GaN. Such a low temperature allows to avoid thermal deterioration of the indium-containing active layer. Simultaneously, crystalline quality of the window layer formed in environment of supercritical ammonia-containing solution is very good, as evaluated by the techniques known in the art.

In nitride semiconductor laser devices, a resonator with the active layer made of the indium-containing nitride semiconductor, called an optical wave-guide, is composed of the active layer and an optical guide layer.

The active layer should have a single quantum well or a quantum multi-well structure, containing at least one of the well layers: InGaN or InAlGaN.

The monocrystalline nitride window layer of the general formula $Al_xGa_{1-x-y}In_yN$, where $0 \leq x+y \leq 1$, $0 \leq x \leq 1$ and $0 \leq y < 1$, deposited on the radiation-emitting end face of the resonator, according to the invention has a composition tailored to the function to be performed by that layer.

For example, in a nitride semiconductor lasers at the resonator end faces the energy gap gets narrower and—consequently—radiation absorption increases at such end faces. Composition of the monocrystalline layer of nitride of the general formula $Al_xGa_{1-x-y}In_yN$, where $0 \leq x+y \leq 1$, $0 \leq x \leq 1$ and $0 \leq y < 1$, is thus determined in such a way as to widen the energy gap, so that radiation absorption near the end face would be suppressed considerably.

Also, in the case of nitride semiconductor lasers with the resonator active layer made of indium-free nitride semiconductor, it is preferred to cover the resonator end faces with a monocrystalline layer of nitride of the general formula $Al_xGa_{1-x-y}In_yN$, where $0 \leq x+y \leq 1$, $0 \leq x \leq 1$ and $0 \leq y < 1$, in low-temperature conditions, in the environment of a supercritical ammonia-containing solution, adjusting the width of the energy gap of this layer material so that it would be wider than the width of the energy gap of the nitride semiconductor of the resonator active layer. Selection of the preferred formula of the semiconductor nitride window layer is thus based on the desired width of the energy gap. The width of the energy gap in nitride semiconductors grows in the sequence: InGaN<GaN<GaAlN<AlN. In nitride semiconductor laser device according to the invention, the thickness of a monocrystalline layer of nitride of the general formula $Al_xGa_{1-x-y}In_yN$, where $0 \leq x+y \leq 1$, $0 \leq x \leq 1$ and $0 \leq y < 1$, should be over 50 angstroms and its thickness should be equal to $n\lambda$, wherein $\lambda$ is a wave length of the radiation emitted by active layer of laser device and n is an integer number.

According to the invention the resonator end face covered with a monocrystalline window layer of nitride of the general formula $Al_xGa_{1-x-y}In_yN$, where $0 \leq x+y \leq 1$, $0 \leq x \leq 1$ and $0 \leq y < 1$, can be covered with additional protective layers, for example, the ones increasing mechanical strength or chemical resistance.

To form a monocrystalline window layer of gallium-containing nitride of the general formula $Al_xGa_{1-x-y}In_yN$, where $0 \leq x+y \leq 1$, $0 \leq x \leq 1$ and $0 \leq y < 1$, on the resonator end face in an adequately low temperature, according to the invention, the environment of a supercritical ammonia-containing solution is applied in compliance with the method disclosed in detail in WO 02/101120, full content of which is incorporated here as reference. The method corresponds to forming a monocrystalline layer of nitride of the general formula $Al_xGa_{1-x-y}In_yN$, where $0 \leq x+y \leq 1$, $0 \leq x \leq 1$ and $0 \leq y < 1$, on a seed. In accordance with the present invention, at least a surface of resonator end face of the laser device of the present invention corresponds to a seed in the process disclosed in WO 02/101120.

Due to application of the crystallization method in the environment of a supercritical ammonia-containing solution it is possible to form a monocrystalline nitride window layer on the resonator end face at temperature lower than 800° C., preferably lower than 600° C., and most preferably lower than 550° C. This method is carried out in high-pressure autoclaves typically made of nickel alloys. Hence, as a result of passing of alloy components into the supercritical ammonia-containing solution, the formed monocrystalline nitride layer contains also such elements as: Ni, Cr, Co, Ti, Fe, Al, Si or Mn.

Nitride semiconductor laser devices can be manufactured on the nitride-based substrates. They can be also manufactured on multi-component substrates, for example on such substrates, wherein—followed by adequate processing—a monocrystalline nitride layer was formed on sapphire, spinel, ZnO, SiC or Si wafers at least on one of its sides. In each of those cases a monocrystalline nitride layer may be formed as a result of lateral overgrowth. Due to application of the crystallization method in the environment of a supercritical ammonia-containing solution it is recommended to use a nitride semiconductor substrate. In the case of nitride semiconductor laser devices, formed on a substrate of a different type (of a composition other than that of the resonator end face covering layer), the substrate material may react with the supercritical ammonia-containing solution during the process. Substrate components will be then introduced into the environment of a supercritical ammonia-containing solution, leading to pollution of the obtained monocrystalline nitride window layer.

Therefore, it is recommended that, prior to covering the resonator end face with a monocrystalline window layer of nitride of the general formula $Al_xGa_{1-x-y}IN_yN$, where $0 \leq x+y \leq 1$, $0 \leq x \leq 1$ and $0 \leq y < 1$, in the environment of a supercritical ammonia-containing solution, other surfaces should be covered with an adequate mask layer.

Particular good results are obtained when a GaN wafer having surfaces susceptible to the lateral overgrowth of crystalline GaN (ELOG structures) is used as the primary substrate 1 (FIG. 1) instead of sapphire.

Figure 11:
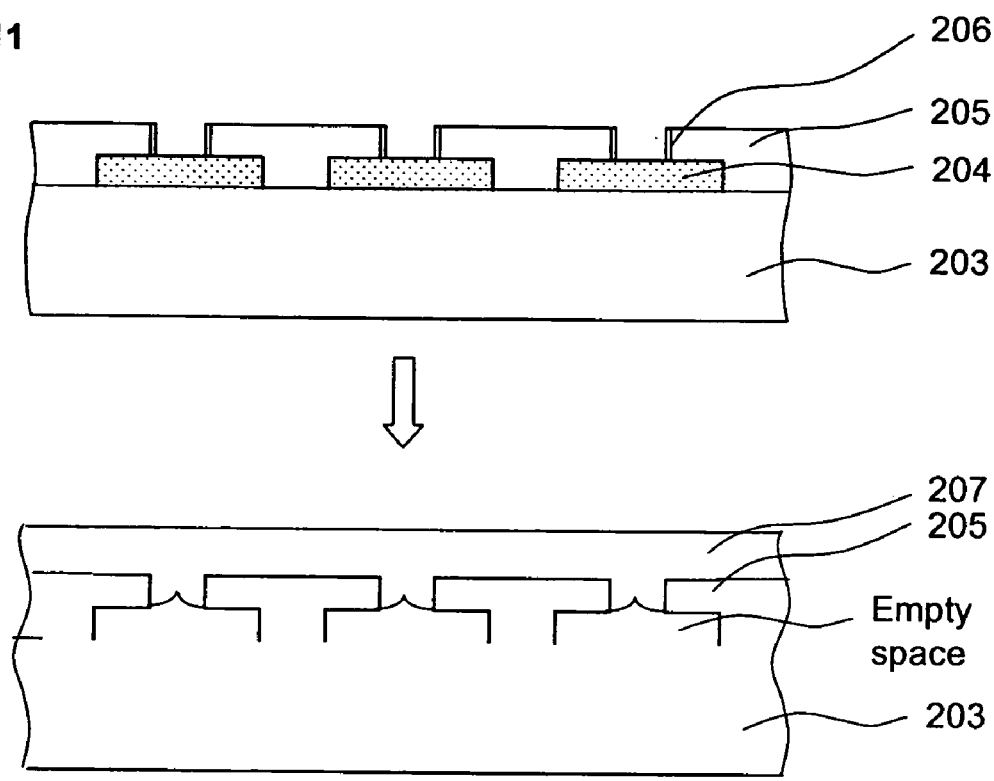

Successive phases of forming the three exemplary types of substrates (for epitaxial formation of nitride semiconductor laser device according to the invention) having the monocrystalline nitride layer formed as a result of the lateral overgrowth are presented in FIG. 9-11.

As presented in FIG. 9, the surfaces 206 susceptible to the lateral overgrowth may be formed through a partial covering of the nitride-based substrate 203 with a mask layer 204. Over the mask layer 204, a monocrystalline nitride layer 207 is formed as a result of the lateral overgrowth. Hence, it is advisable that the mask layer 204 should not dissolve or dissolve slightly in the supercritical ammonia-containing solution. It may be for example made of metallic silver—Ag. The mask layer may be also used for protecting other—all or some—surfaces of the primary substrate.

As shown in FIG. 10, the monocrystalline nitride layer 207, formed as a result of the lateral overgrowth may be also formed on the nitride-based substrate 203 of a surface shaped in the form of stripes 205. In this case it was formed on the side walls 206 of stripes 205. It is also possible to carry out a lateral overgrowth of this layer on selected side walls 206.

As presented in FIG. 11, the monocrystalline nitride layer 207 may be formed only on the part of the nitride-based substrate 203. Consequently, the surface dislocation density of the layer 207 is significantly lower than that of the nitride-based substrate 203. In this case, the nitride-based substrate 203 was partially covered with the mask layer 204, and the monocrystalline nitride layer 205 was grown out of the mask layer openings 204 up-ward and laterally. In result, stripes made of a nitride semiconductor having a cross-section similar to T-bars were formed. After the mask layer 204 is removed only those T-bars remain, and a further monocrystalline nitride layer 207 is formed on them as a result of the lateral overgrowth.

In order to form on the primary substrate a layer made of a monocrystalline nitride of the general formula $Al_xGa_{1-x-y}IN_yN$, where $0 \leq x+y \leq 1$, $0 \leq x \leq 1$ and $0 \leq y < 1$, which could be used for epitaxial formation of nitride semiconductor laser device according to the invention, it is recommended that it should be formed at relatively low temperature. This is possible if the crystallization method carried out in the environment of a supercritical ammonia-containing solution as disclosed in WO 02/101120 is used. In the case of formation a preferred substrate for nitride semiconductor laser device according to the present invention—crystallization of desired group XIII nitride takes place on the surfaces susceptible to the lateral overgrowth of nitrides arranged on the primary substrate. Under such conditions it is possible to form—as a result of the lateral overgrowth—the monocrystalline nitride layer at temperature lower than 600° C. and preferably lower than 550° C. on the properly shaped primary substrate, as described above. Implementation of the crystallization method in the environment of a supercritical ammonia-containing solution in a typical high-pressure autoclave causes that the monocrystalline nitride layer as formed due to the lateral overgrowth contains also such elements as: Ni, Cr, Co, Ti, Fe, Al, Si and Mn. It is recommended that the thickness of a monocrystalline nitride layer formed as a result of the lateral overgrowth should be higher than 1 μm.

The window layers deposited in accordance with the present invention have both high quality and desired thickness. Such layers may have surface dislocation density of less than $10^6/cm^2$ and FWHM of X-ray rocking curve from (0002) plane of 50 arcsec or less.

Due to the production process, the mono-crystalline gallium-containing nitride window layer may contain alkali elements, usually in an amount of more than about 0.1 ppm. Generally it is desired to keep the alkali-elements content lower than 10 ppm.

The mono-crystalline gallium-containing nitride window layer may additionally comprise traces of Ti, Fe, Co, Cr, and Ni introduced in the production process in effect of corrosion of the autoclave under the process condition. Such trace impurities do not adversely affect the properties of the obtained window layer.

Generally, halogens are not intentional components of a mono-crystalline gallium-containing nitride window layer of the present invention. However, it is also possible that halogens are present therein. It is usually desired to keep the halogen content of gallium-containing nitride in the range of about 0.1 ppm or less.

The window layer on radiation-emitting end face of resonator of the nitride semiconductor laser device according to the invention is obtained by a method involving dissolution of a Group XIII elements feedstock in a super-critical solvent and crystallization of a gallium-containing nitride on a surface of the end face, with over-saturation of the supercritical solution with respect to gallium-containing nitride being reached by means of temperature and/or pressure variations. In a preferred embodiment it is obtained by a method involving dissolution of a gallium feedstock in a supercritical solvent and crystallization of a gallium nitride on a surface of the end face, at temperature higher and/or pressure lower than in the dissolution process.

Typically, the supercritical solvent contains ammonia and/or its derivatives, and includes ions of elements of Group I—at least lithium or sodium ions, the feedstock consists essentially of gallium-containing nitride and/or its precursors, selected from a group including azides, imides, amido-imides, amides, hydrides, gallium-containing metal compounds and alloys, as well as metallic Group XIII elements, especially metallic gallium.

In the process in which a nitride mono-crystalline window layer of the present invention is formed, crystallization of gallium-containing nitride takes place in an autoclave, at temperatures ranging from 100° C. to 800° C. and at pressures from 10 MPa to 1000 MPa and a molar ratio of ions of elements of Group I is usually not higher than 1:2, in the terms of the moles of the metal ion based on the moles of the solvent (molar ratio). In a preferred embodiment the concentration is not higher than 1:5, more preferably not higher than 1:20 (moles of the metal ion based on the moles of the solvent).

As a source of alkali-metal ions alkali metals or alkali metal compounds, excluding those containing halogens, are used. The growth of a mono-crystalline gallium-containing nitride window layer is controlled by means of adjusting temperature and pressure of dissolution step and temperature and pressure of crystallization step. Crystallization step requires a temperature range of 400° C. to 600° C.

According to the present invention a mono-crystalline gallium-containing nitride window layer is crystallized in an autoclave with two separated zones—dissolution zone and crystallization zone, with a temperature difference between the two zones during crystallization not bigger than 150° C., preferably not bigger than 100° C. The control of over-saturation of supercritical solution with respect to gallium-containing nitride in the crystallization zone of the autoclave with two separated zones and a predetermined temperature difference between the two zones is achieved by controlling chemical (mass) transport between the two zones by means of use of a baffle or baffles separating the two zones and/or by means of using a feedstock material containing gallium in a form of gallium-containing nitride crystals having a total surface area bigger than a total surface area of the resonator end face on which the window layer is formed.

Preferably, the dissolution step and the crystallization step are conducted—at least partially—simultaneously in the same autoclave. For such an embodiment pressure is practically uniform within the reaction vessel, while temperature difference between the dissolution zone and crystallization zone should be at least 1° C., and preferably from 5° C. to 150° C. Furthermore, the temperature difference between the dissolution zone and crystallization zone should be controlled so as to ensure a chemical transport in the supercritical solution, which takes place through convection in an autoclave.

In the present invention many materials containing Group XIII element(s), in particular gallium, which are soluble in the supercritical solvent under the conditions of the present invention, can be used as a feedstock. Typically, a gallium-containing feedstock will be a substance or mixture of substances, which contains at least gallium, and optionally alkali metals, other Group XIII element(s), nitrogen, and/or hydrogen, such as metallic elements of Group XIII, in particular Ga, alloys and inter-metallic compounds, hydrides, amides, imides, amido-imides, azides. Suitable gallium-containing feedstock can be selected from the group consisting of gallium nitride—GaN, azides such as $Ga(N_3)_3$, imides such as $Ga_2(NH)_3$, amido-imides such as $Ga(NH)NH_2$, amides such as $Ga(NH_2)_3$, hydrides such as $GaH_3$, gallium-containing alloys, metallic gallium and mixtures thereof. Preferred feedstock is metallic gallium, gallium nitride and mixtures thereof. Most preferably, the feedstock is metallic gallium or gallium nitride. If other elements of Group XIII are to be incorporated into the gallium-containing nitride crystal, corresponding compounds or mixed compounds including Ga and the other Group XIII element can be used. If the substrate is to contain dopants or other additives, precursors thereof can be added to the feedstock.

The form of the feedstock is not particularly crucial and it can be in the form of one or more pieces or in the form of a powder. If the feedstock is in the form of powder, care should be taken that individual powder particles are not transported from the dissolution zone to the crystallization zone, where they can cause uncontrolled crystallization. It is preferable that the feedstock is in form of one or more pieces and that the surface area of the feedstock is larger than that of the crystallization seed.

The nitrogen-containing solvent employed in the present invention must be able to form a supercritical fluid, in which gallium can be dissolved in the presence of alkali metal ions. Preferably the solvent is ammonia, a derivative thereof or mixtures thereof. A suitable example of ammonia derivative is hydrazine. Most preferably the solvent is ammonia. To reduce corrosion of the reactor and to avoid side-reactions, halogens e.g. in the form of halides are preferably not intentionally added into the reactor. Although traces of halogens may be introduced into the system in the form of unavoidable impurities of the starting materials, care should be taken to keep the amount of halogens as low as possible. Due to the use of a nitrogen-containing solvent such as ammonia it is not necessary to include nitride compounds into the feedstock.

It has turned out that also other gallium compounds and even metallic gallium may become sources of gallium ammonia complexes. For example, gallium complexes could be introduced into a solvent having the above composition starting with the simplest substrate, i.e. metallic gallium. By means of appropriate change in conditions (e.g. increase in temperature) formation of a gallium-nitride over-saturated solution is obtained and crystallization on seed occurs.

The solubility of feedstock, namely gallium and corresponding elements of Group XIII and/or their compounds, can be significantly improved by the presence of at least one type of alkali metal-containing component as a solubilization aid ("mineralizer"). Lithium or a mixture of lithium and sodium are preferred as alkali metals. The mineralizer can be added to the supercritical solvent in elemental form or in the form of alkali metal compound. Generally the choice of the mineralizer depends on the solvent employed in the process.

If the mineralizer is in the form of a compound, it is preferably an alkali metal hydride such as MH, an alkali metal nitride such as $M_3N$, an alkali metal amide such as $MNH_2$, an alkali metal imide such as $M_2NH$ or an alkali metal azide such as $MN_3$ (wherein M is an alkali metal). The concentration of the mineralizer is not particularly restricted and is selected so as to ensure adequate levels of solubility of feedstock (the starting material), crystallization seed and gallium-containing nitride (the resulting product). It is usually not higher than 1:2, in the terms of the moles of the metal ion based on the moles of the solvent (molar ratio). In a preferred embodiment the concentration is not higher than 1:5, more preferably not higher than 1:20 (moles of the metal ion based on the moles of the solvent).

The presence of the alkali metal in the process can lead to the presence of alkali-metal elements in the thus prepared nitride mono-crystalline window layer. It is possible that the amount of alkali metal elements is more than about 0.1 ppm, even more than 10 ppm. However, in these amounts the alkali metals do not detrimentally effect the properties of the mono-crystals. It has been found that even at alkali metal content of 500 ppm, the operational parameters of a nitride mono-crystalline window layer formed according to the invention are still satisfactory.

The dissolved feedstock crystallizes in the crystallization step under the low solubility conditions on the radiation emitting end face of nitride semiconductor laser device placed in the autoclave.

Preferably, gallium-containing nitride window layer consists essentially of GaN, GaAlN or AlN.

A careful combination of the above discussed process features leads to obtaining good quality of gallium-containing nitride window layer. Depending on the duration of the process and the size of an autoclave used desired thickness of the window layer, bigger than 50 Å, may be reached.

Due to the good crystalline quality, the obtained window layer of gallium-containing nitride of the present invention improves significant durability and lifetime of nitride semiconductor laser devices, in particular for nitride lasers and laser diodes.

Further herein a detailed description of the embodiments of the present invention is provided.

The cross-section of the nitride semiconductor laser device according to the present invention is shown on the enclosed FIG. 1. On the substrate in form of a sapphire wafer or gallium-containing nitride substrate 1 the n-type nitride semiconductor layers 2 and the p-type nitride semiconductor layers 4 were deposited. Between them there is the active layer 3 in the form of an indium-containing nitride semiconductor quantum multi-well layer. The n-type nitride semiconductor layers 2 are composed of the n-type contact layer 21, the crack-preventing layer 22, the (emitter) n-type clad layer 23 and the n-type optical guide layer 24. The p-type nitride semiconductor layers 4 are composed of the electron confining layer 41, the p-type optical guide layer 42, the (emitter) p-type clad layer 43 and the p-type contact layer 44.

In the above structure, the nitride laser resonator is composed of the aforementioned active layer 3, the n-type optical guide layer 24 and p-type optical guide layer 42 and the electron confining layer 41. The resonator radiation-emitting end face is covered with a monocrystalline layer 5 of nitride of the general formula $Al_xGa_{1-x-y}IN_yN$. If an analogous layer is also laid on the resonator end face on the side that reflects radiation it is possible to reduce damage caused thereto by absorption of radiation.

The successive phases of the nitride semiconductor laser manufacturing process are illustrated on the diagrammatic drawing FIG. 2. Accordingly, the buffer layer 11 grown at low temperatures is deposited on the substrate in form of sapphire wafer 1 and on the buffer layer there are deposited one after another: the n-type nitride semiconductor layer 2, the active layer 3 and the p-type nitride semiconductor layer 4.

The obtained nitride semiconductor structure is subject to etching, as a result of which resonator end faces are uncovered (FIG. 2-B). The uncovered resonator end faces are covered with a monocrystalline layer of nitride of the general formula $Al_xGa_{1-x-y}IN_yN$ in the environment of a supercritical ammonia-containing solution. For that purpose the laser structured substrate is placed in a high-pressure autoclave together with the feedstock necessary for producing the monocrystalline layer of nitride of the general formula $Al_xGa_{1-x-y}IN_yN$ and with the mineralizer. The autoclave is closed and filled with ammonia. The solution is brought to a supercritical condition through adequate temperature and pressure adjustment.

Figure 4:
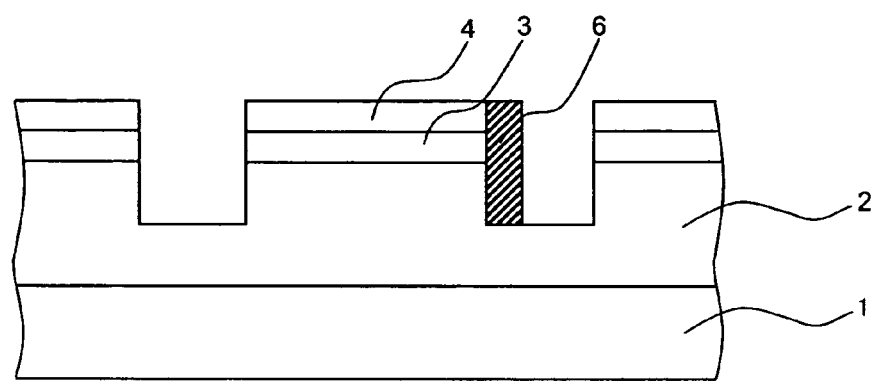
FIGS. 4-6 illustrate a crosssection of structures of the nitride semiconductor laser with selected surfaces covered with mask layers.
Figure 5:
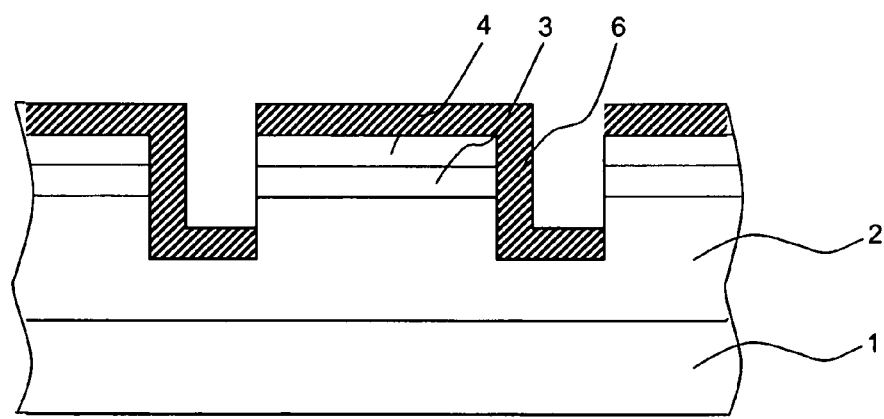
Figure 6:
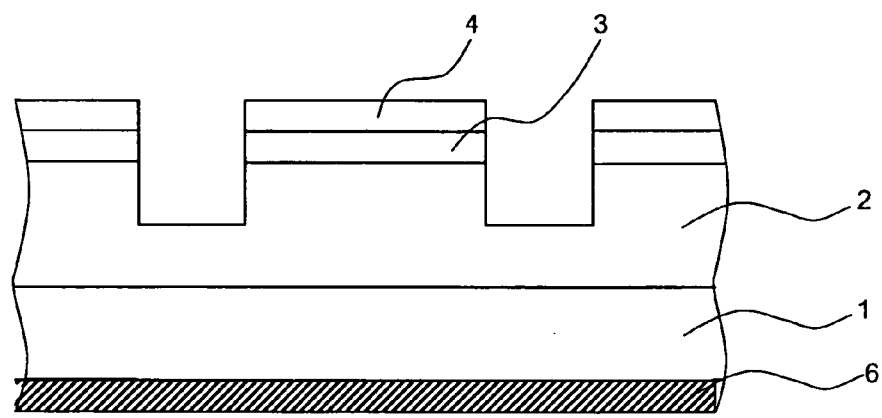

In this case crystallization of a monocrystalline layer of nitride of the general formula $Al_xGa_{1-x-y}IN_yN$ takes place on the laser device structure (FIG. 2-B) formed by deposition on the substrate 1 in succession of: the n-type nitride semiconductor layer 2, the active layer 3 and the p-type nitride semiconductor layer 4. This structure is an equivalent of the crystallization seed, as referred to in the quoted WO 02/101120. Instead of this structure, it is also possible to use structures that are deprived of all layers except for the nitride ones, such as sapphire substrate (FIG. 3). Moreover, it is possible to use the resonator laser structures wherein only the radiation-reflecting end face is covered with the mask layer 6 (FIG. 4) or resonator structures whose all surfaces except for the radiation-emitting end face are covered with the mask layer 6 (FIG. 5), or finally structures wherein only the uncovered sapphire layer 1 surfaces are covered with the mask layer 6 (FIG. 6). The aforementioned mask layer 6 may be formed of the material which does not become etched in the supercritical ammonia-containing solution or—if it does—it is not an undesirable dopant in a formed monocrystalline window layer of nitride of the general formula $Al_xGa_{1-x-y}IN_yN$. For example, metallic silver can be used as that sort of material.

As a result of a high-pressure reaction in the autoclave, a monocrystalline layer of nitride of the general formula $Al_xGa_{1-x-y}IN_yN$ is formed on uncovered surfaces of the nitride semiconductor laser device structure (FIG. 2-C).

The above method of forming a monocrystalline nitride layer in the environment of a supercritical ammonia-containing solution is based on taking an advantage of negative temperature coefficient of solubility of compounds of the aforementioned general formula $Al_xGa_{1-x-y}IN_yN$ in the supercritical solvent containing ammonia and alkali metal ions.

The negative temperature coefficient of solubility means that a specific nitride exhibits lower solubility at high temperature and higher solubility at low temperature. Thus, if high- and low-temperature zones are obtained in the autoclave, dissolution of a nitride takes place in the low-temperature zone and crystallization thereof takes place in the high-temperature zone. As a result of convection generated between the low-temperature zone and the high-temperature zone, adequate supersaturation of the solution is maintained in the reaction chamber in the high-temperature zone, due to which a selective growth of nitrides on seeds takes place.

The laser structure is thus placed in the higher-temperature zone (in the crystallization zone), and the feedstock in the lower-temperature zone of the autoclave (in the dissolution zone). Dissolution of the feedstock takes place in the dissolution zone. In the entire system, as a result of a temperature difference a convection mass flow is generated, due to which the dissolved feedstock is transported to the higher-temperature zone. Due to a lower solubility at high temperatures, a supercritical solution becomes supersaturated in the crystallization zone and it results in that the dissolved feedstock becomes crystallized on the laser structure placed in that zone. Crystallization approached in this way results in forming a monocrystalline window layer of nitride of the general formula $Al_xGa_{1-x-y}IN_yN$ which is a crucial element of this invention. Moreover, a characteristic feature of this method, as compared to the methods by which nitride layers are formed of the gaseous phase at temperatures of over 900° C., is the fact that it allows growth of monocrystalline nitride layers at temperatures substantially lower than 800° C., preferably lower than 600° C., and most preferably lower than 550° C. Due to this, in the laser structure placed in the higher-temperature zone a thermal deterioration of the indium-containing nitride semiconductor active layer does not take place.

GaN or its precursor may be used as feedstock in a preferred embodiment of the invention. GaN may be used in the form of wafers obtained by methods of growth from the gaseous phase, such as: HVPE (Halide Vapor Phase Epitaxy) or MOCVD (Metallo-Organic Chemical Vapor Deposition), or else by the method of crystallization on seeds in the environment of a supercritical ammonia-containing solution. Compounds selected from gallium azide, gallium amide, metallic gallium or their mixtures can be used as a precursor of gallium nitride.

In the method of crystallization in the environment of a supercritical ammonia-containing solution, it is possible to use alkali metals, such as: Li, Na or compounds of alkali metals, such as: hydrides, amides, imides, amide-imides or azides as a mineralizer.

According to the invention it is recommended that the thickness of the monocrystalline window layer 5 of nitride of the general formula $Al_xGa_{1-x-y}IN_yN$ is greater than 50 angstroms. If thickness thereof is less than 50 angstroms, the effect of smoothing of the etched surface will be lesser. On the other hand the top limit of thickness depends on a production capacity of a manufacturer.

Moreover, according to the present invention, the monocrystalline window layer 5 of nitride of the general formula $Al_xGa_{1-x-y}IN_yN$ is formed preferably on the surface of stripes and end faces and on the surface of the n-type contact layer. 21, but it is recommended that overgrowth of the window layer 5 on the surface of the n-type contact layer 21 be kept at the level of less than 2 μm so that it would not fill in the stripe active layer.

To improve the smoothing effect of the window layer 5, it is recommended according to this invention that the content of Al in a monocrystalline layer of nitride of the general formula $Al_xGa_{1-x-y}IN_yN$ be lower. Nevertheless, to improve operation of the window structure, a small content of Al is desirable. Therefore Al content should not be zero, and the window layer 5 should be preferably composed of a nitride of the formula $Al_xGa_{1-x-y}IN_yN$.

By forming the window layer 5 on the etched lateral stripe surfaces and resonator end faces, it is possible to bring them to high smoothness. In other words, just after being etched the stripe and end faces are relatively irregular and deposition of the window layer 5 thereon fills-in irregularities and makes surfaces smooth. Moreover, the window layer 5 can be a homogenous one, but it can be also composed of several layers varied in composition, especially in Al content.

After the window layer 5 is formed, the structure is subject to further typical processing to form ridges which are next covered with the $ZrO_2$ protective layer 70. On the top part of the ridges a p-type electrode 80 is formed so that it could be in contact with the p-type contact layer 43 with an ohmic contact being assured. Next, the n-type electrodes 90 arranged parallel to the p-type electrodes are formed on the surface of the n-type contact layer 21. In further sequence, the p-type pad electrode 110 and n-type pad electrode 120 are formed. Moreover, the $SiO_2/TiO_2$ insulating coating is formed to cover the entire element except for the p-type electrode and the n-type electrode, and due to an alternate arrangement of the $SiO_2$ and $TiO_2$ layers it serves as the radiation-reflecting layer 100 when the laser diode is excited. Finally, individual laser diodes are cut out from the wafer. In this way a finished nitride semiconductor laser device (FIG. 1) is obtained.

The radiation-emitting end faces of nitride semiconductor laser devices of types other than described above can be covered with the monocrystalline nitride window layer in the same way.

The present invention is further illustrated in the following examples, serving only serve as an illustration. The invention is not however limited to the following examples only.

EXAMPLE 1

First, the sapphire wafer 1 of 2 inch diameter and a surface essentially perpendicular to c-axis is placed in the MOCVD reactor. Temperature is set at 510° C. Hydrogen is used as carrier gas and gaseous substrates of the reaction are: ammonia and TMG (thrimethylgallium). The GaN buffer layer 11 of 200 angstrom thick is formed on the sapphire wafer, in the conditions of low-temperature growth.

On the buffer layer, the following layers are deposited one after the other:

(1) 4 μm thick n-type GaN contact layer, doped with Si at the level of $3\times10^{18}/cm^3$.
(2) 1.5 μm thick undoped $In_{0.06}Ga_{0.94}N$ crack-preventing layer.
(3) n-type clad layer, in the form of the superlattice of the total thickness being 1.21 μm, formed by alternate deposition of 25 angstroms thick undoped $In_{0.1}Ga_{0.9}N$ layers and n-type GaN layers doped with Si at the level of $1\times10^{19}/cm^3$.
(4) 0.2 μm thick undoped n-type GaN optical guide layer of.
(5) the active layer of the total thickness being 380 angstroms in the form of a quantum well of the structure of alternately arranged barrier and well layers, wherein 100 angstroms thick $In_{0.05}Ga_{0.95}N$ layer forms the barrier layer, and 40 angstroms thick undoped $In_{0.1}Ga_{0.9}N$ leyer forms the well layer.
(6) p-type electron confining layer in form of 300 angstroms thick p-type $Al_{0.3}Ga_{0.7}N$ layer, doped with Mg at the level of $1\times10^{20}/cm^3$.
(7) 0.2 μm thick undoped GaN p-type optical guide layer.
(8) p-type clad layer in the form of the superlattice of the total thickness being 0.6 μm, formed by alternate deposition of 25 angstroms thick undoped $In_{0.16}Ga_{0.84}N$ layers and 25 angstroms thick undoped GaN layers.
(10) 150 angstroms thick p-type contact layer of p-type GaN doped with Mg at the level of $1\times10^{20}/cm^3$.

After the above layers have been deposited, the formed nitride semiconductor structured substrate is subject to annealing in the MOCVD device under the nitrogen atmosphere, at temperature of 700° C., which additionally reduces resistance of the p-type nitride semiconductor layer.

After annealing, the substrate is taken out from the reactor and a mask layer in the form of $SiO_2$ strips is deposited on the surface of the top p-type contact layer. Next, by using the RIE method (reactive ion etching), the parallel laser structures are formed in the form of stripes, uncovering thereby resonator end faces and the surface of the n-type contact layer. The $SiO_2$ mask layer formed on the surface of the top p-type contact layer is removed using the wet etching method.

Next, the laser structured substrate is introduced into the approx. 36 cm³ high-pressure autoclave together with the feedstock in the form of GaN (about 0.5 g) wafers obtained by the HVPE method and a mineralizer in the form of metallic lithium (about 0.018 g) of 3N purity.

Figure 7:
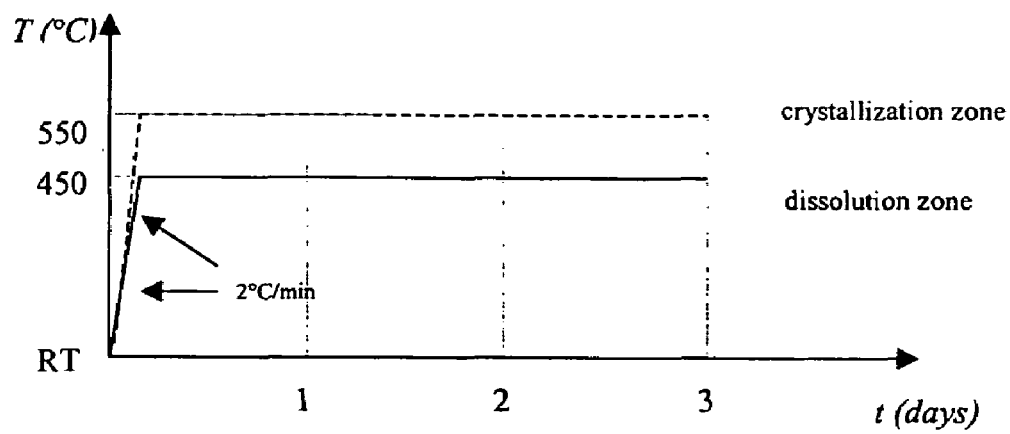
FIG. 7 presents variation of temperature as a function of time for Example 1.

Having been filled with ammonia (about 14.5 g) the high-pressure autoclave is tightly closed and heated in a two-zone furnace, with the maximal temperature inside the autoclave not exceeding 550° C. The autoclave reaction chamber is divided into two zones: the crystallization zone and the dissolution zone. In the crystallization zone (at temperature of about 550° C.) there is a laser structured substrate, whereas in the dissolution zone (at temperature of about 450° C.) there is feedstock in the form of GaN wafers. The sealed autoclave is kept in constant temperature conditions for three days (FIG. 7).

Under the conditions, in the environment of a supercritical ammonia-containing solution, a desired about 1 μm thick monocrystalline gallium nitride (GaN) layer 5 is grown on the lateral stripe walls and the uncovered surfaces of the n-type contact layer and p-type contact layer.

After a GaN monocrystalline layer 5 is formed on the resonator end face, the monocrystalline GaN formed on the surface of the top p-type contact layer is removed by etching. Next, the uncovered surface of the p-type contact layer is covered with the mask layer in the form of 1.5 μm wide $SiO_2$ strips of and etching of the p-type clad layer is continued until ridges are formed on the stripe part. Etching is continued until thickness of the p-type clad layer is 0.1 µm on both sides of ridges.

In this way a ridge part of 1.5 µm width is formed.

Next, by use of the ion sputtering method, a 0.5 µm thick $ZrO_2$ coating is formed so that it would cover stripe surfaces from the top surface of the $SiO_2$ mask layer.

In effect of this thermal processing, the protective layer 70 in the form of the $ZrO_2$ coating is deposited on the top stripe surface, on lateral walls of ridges and on the surface of the p-type clad layer located on both sides of ridges. This coating allows to stabilize a lateral mode at the moment of laser actuation.

Next the p-type electrode 80 in the form of Ni/Au is formed on the p-type contact layer so that an ohmic contact would appear, and the n-type electrode 90 in the form of Ti/Al—on the n-type contact layer. Then, the semiconductor wafer with laser structures thus prepared is subject to thermal processing at temperature of 600° C. Next, adequate pad electrodes in the form of Ni(1000 Å)-Ti(1000 Å)-Au (8000 Å) are laid on the p-type 80 and n-type 90 electrodes. After the radiation-reflecting surface 100 in the form of $SiO_2$ and $TiO_2$ layers has been formed, the finished nitride semiconductor lasers are cut out from the wafer.

Nitride semiconductor lasers manufactured in this way are equipped with a heat sink. Due to an increase of a COD (Catastrophic Optical Damage) threshold, as a result of covering the resonator end face with the monocrystalline nitride layer 5 it is observed that after the laser is excited in a continues operation mode—with the threshold current density of 2.0 kA/cm$^2$, the power output of 100 mW and the 405 nm light wavelength—the average lifetime of the laser is substantially extended as compared to the average lifetime of analogous lasers without such a monocrystalline layer.

EXAMPLE 2

In this Example 2, only the resonator radiation-emitting end face is covered with a GaN monocrystalline layer, whereas other stages of laser production are carried out as in Example 1. The laser element made in this way is also equipped with a heat sink. Similar as in Example 1, the average lifetime of the laser—with the threshold current density of 2.0 kA/cm$^2$, the power output of 100 mW and the 405 nm light wavelength—is extended.

EXAMPLE 3

In this Example 3, after the buffer layer is formed on a sapphire wafer, a 100 µm thick GaN layer is deposited by the HVPE method. Next, as in Example 1, the n-type nitride semiconductor layer, the active layer and the p-type nitride semiconductor layer are formed.

Next, sapphire is removed and consequently a homogenous GaN substrate is obtained. In the successive stages, as in Example 1, resonator end faces are uncovered and subsequently covered with a 0.5 µm thick GaN monocrystalline layer crystallized in the environment of a supercritical ammonia-containing solution. In the case of the nitride semiconductor laser thus obtained, its parameters may be expected to get improved as in Example 1.

EXAMPLE 4

The same procedures as in Example 1 are followed, except that the sapphire wafer is covered with a metallic silver coating. In other respects, production of the laser diode is analogous to that in Example 1.

EXAMPLE 5

The same procedures as in Example 1are followed, except that a different mineralizer is used to obtain the monocrystalline gallium nitride (GaN) window layer 5, formed by re-crystallization form supercritical ammonia-containing solution. Instead of metallic lithium, lithium azide ($LiN_3$) in the amount of 0.13 g is introduced into the autoclave. The gallium nitride window layer 5 formed in this process has the thickness of about 1 µm.

EXAMPLE 6

The same procedures as in Example 1 are followed, except that a mixture of metallic lithium and metallic sodium is used as a mineralizer when forming the monocrystalline gallium nitride (GaN) window layer 5 by re-crystallization form supercritical ammonia-containing solution. Thus, 0.016 g of metallic lithium and 0.006 g of metallic sodium are introduced into the autoclave, giving the molar ratio of Li:Na=9:1. The gallium nitride window layer 5 formed in this process has the thickness of about 1 µm.

EXAMPLE 7

The same procedures as in Example 1 are followed, except that a different feedstock material is used when forming the monocrystalline gallium nitride (GaN) window layer 5 by re-crystallization form supercritical ammonia-containing solution. Namely, the laser structured substrate is introduced into the approx. 36 cm$^3$ high-pressure autoclave together with the feedstock in the form of metallic gallium (about 0.6 g) and a mineralizer in the form of metallic lithium (about 0.018 g) of 3N purity.

Figure 8:
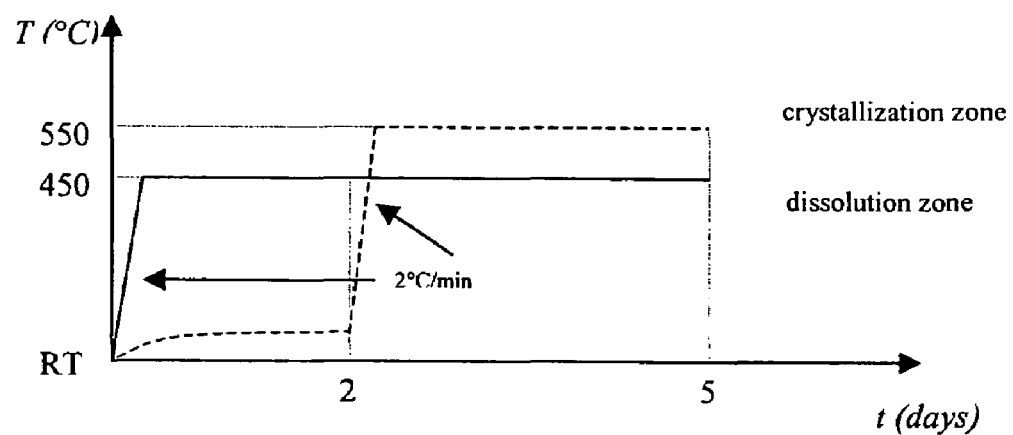
FIG. 8 presents variation of temperature in the function of time for Example 7.

Having been filled with ammonia (about 14.5 g) the high-pressure autoclave is tightly closed and heated in a two-zone furnace. The autoclave reaction chamber is divided into two zones: the crystallization zone and the dissolution zone. The dissolution zone, containing the gallium feedstock, is heated to 450° C. (at 2° C./min), while the crystallization zone, containing the laser structured substrate, is not heated and the temperature in this zone is not significantly higher than room temperature. This temperature is maintained inside the autoclave for the next two days (FIG. 8), during which the metallic gallium feedstock reacts completely to polycrystalline-GaN. The temperature of the crystallization zone is then increased to 550° C. (at 2° C./min). The autoclave is kept in such thermal conditions for three days (FIG. 8).

The gallium nitride window layer 5 grown in this process on the lateral stripe walls and the uncovered surfaces of the n-type contact layer and p-type contact layer has the thickness of about 0.8 µm.

EXAMPLE 8

The same procedures as in Example 1 are followed, except that a monocrystalline AlGaN window layer 5 is formed by re-crystallization form supercritical ammonia-containing solution.

In this Example 8, the laser structured substrate is introduced into the approx. 36 cm$^3$ high-pressure autoclave together with the feedstock in the form of GaN wafers obtained by the HVPE method (about 0.25 g) as well as four polycrystalline-AlN pellets (0.83 g) and a mineralizer in the form of metallic lithium (about 0.018 g) of 3N purity.

Having been filled with ammonia (about 14.5 g) the high-pressure autoclave is tightly closed and heated in a two-zone furnace, with the maximal temperature inside the autoclave not exceeding 550° C. The autoclave reaction chamber is divided into two zones: the crystallization zone and the dissolution zone. In the crystallization zone (at temperature of about 550° C.) there is a laser structured substrate, whereas in the dissolution zone (at temperature of about 450° C.) there is feedstock. The sealed autoclave is kept in constant temperature conditions for three days (FIG. 7).

As the result of this process, a monocrystalline window layer 5 having the composition of $Al_{0.03}Ga_{0.97}N$ is formed on the lateral stripe walls and the uncovered surfaces of the n-type contact layer and p-type contact layer. The window layer 5 has the thickness of about 0.9 μm.

EXAMPLE 9

The same procedures as in Example 1 are followed, except that instead of a sapphire wafer 1 a gallium-containing nitride substrate prepared as described below is used and it results in a better performance of epitaxial nitride semiconductor layers deposited as described in Example 1.

In the first stage, on the sapphire wafer 201 having a surface oriented perpendicularly to c-axis, at temperature of 500° C., with use of hydrogen as carrier gas and gaseous reagents: ammonia and TMG (thrimethylgallium), the buffer layer 202 is deposited, whereon at a usual growth temperature a n-type semiconductor nitride layer 203 is deposited by MOCVD (FIG. 10-A). Thickness of the buffer layer 202 ranges from 50 to 500 angstroms. There are however no limitations as to the thickness of the subsequent nitride semiconductor layer 203, other than those arising for the method of depositing thereof.

Next, the aforementioned nitride semiconductor layer 203 is subject to etching so as to develop a surface having a structure of parallel stripes 205 (FIG. 10-B). Due to the fact that in the environment of a supercritical ammonia-containing solution the sapphire wafer 201 reacts with the solution, adversely affecting the quality of a monocrystalline nitride layer formed in that environment, the uncovered sapphire surfaces 201 should be covered with the protective mask layer 204 made of the material that does not dissolve in a supercritical ammonia-containing solution, or—if it does—it does not provide undesirable dopants in the obtained monocrystalline ammonia layer. Metallic silver is an example of that sort of material.

In the next stage, on the primary substrate prepared in this way, a monocrystalline nitride layer 207 is formed as a result of the lateral overgrowth by the crystallization method in the environment of a supercritical amrnmonia-containing solution. For that purpose the primary substrate is put into the high-pressure autoclave, of the same type as used in a process of forming a window layer 5 in Example 1. Apart from the substrate, the feedstock and a mineralizer are put into the autoclave, to be used for formation of the monocrystalline nitride layer. After ammonia is introduced into the autoclave, the autoclave is tight closed and the solution is brought to a supercritical state by way of an adequate temperature control.

The nitride wafer formed in effect of the lateral overgrowth of crystalline nitrides is then used as the substrate 1 instead of a sapphire wafer.

EXAMPLE 10

The same procedures as in Example 1 are followed, except that a SiC wafer having surfaces susceptible to the lateral overgrowth of crystalline GaN (ELOG structures) is used as the primary substrate instead of sapphire. The ELOG structures are formed as described in Example 9. The results are comparable to those in Example 1.

As explained above, and in accordance with the aforementioned embodiments of the invention, a particularly important advantage of nitride semiconductor laser devices, according to the invention, is an improvement of performance parameters of said laser devices. According to the invention, at least the radiation-emitting end face of the two opposite resonator end faces, is covered with a monocrystalline window layer of nitride of the general formula $Al_xGa_{1-x-y}IN_yN$ deposited at a temperature so low that it does not cause damage to the indium-containing nitride semiconductor active layer. Due to this it is possible to extend the energy gap in the area of the radiation-emitting end face. This allows to reduce radiation absorption at the end face and increase the COD threshold. Owing to this invention it is possible to manufacture over 100 mW nitride semiconductor lasers characterized by higher reliability and durability.

REFERENCE NUMERALS 1. sapphire wafer
2. n-type nitride semiconductor layer
3. active layer;
4. p-type nitride semiconductor layer;
5. a monocrystalline layer of nitride of the formula $Al_xGa_{1-x-y}IN_yN$
6. mask layer;
11. buffer layer;
21. n-type contact layer;
22. crack-preventing layer;
23. n-type clad layer;
24. n-type optical guide layer;
41. electron confining layer;
42. p-type optical guide layer;
43. p-type clad layer;
44. p-type contact layer;
70. protective layer;
80. p-type electrode;
90. n-type electrode;
100. radiation-reflecting layer;
110. p-type pad electrode;
120. n-type pad electrode.
201. primary substrate (GaN wafer, or sapphire, spinel, ZnO, SiC or Si wafer);
202. nitride buffer layer;
203. nitride semiconductor layer (n-type);
204. mask layer;
205. crystalline nitride bars having surfaces susceptible to the lateral overgrowth;
206. surfaces susceptible to the lateral overgrowth marked by double line;
207. monocrystalline nitride layer formed by the lateral overgrowth;

The invention claimed is:

1. A nitride semiconductor laser device provided with a window layer on a light-emitting end face of a resonator which comprises an active layer of a nitride semiconductor between n-type nitride semiconductor layers and p-type nitride semiconductor layers, wherein:

at least a radiation-emitting end face of said resonator is covered by said window layer comprising monocrystalline nitride of general formula $Al_xGa_{1-x-y}In_yN$, where $0 \leq x+y \leq 1$, $0 \leq x \leq 1$ and $0 \leq y < 1$, having a wider energy gap than that of the active layer and being formed at a low temperature so as not to damage said active layer, wherein said window layer comprises at least one of the metals of Group I.

2. The nitride semiconductor laser device according to claim 1, wherein a thickness of the end face window layer is higher than 50 Å, and is equal to an integer multiplicity of the emitted radiation wavelength (nλ).

3. The nitride semiconductor laser device according to claim 1, wherein the end face window layer is of monocrystalline $Al_xGa_{1-x}N$ ($0 \leq x \leq 1$) and is formed in a supercritical ammonia-containing solution.

4. The nitride semiconductor laser device according to claim 3, wherein at least a p-type contact layer of the resonator is covered by a mask.

5. The nitride semiconductor laser device according to claim 1, wherein the resonator active layer has a structure of a multiquantum-well layer comprising at least one InGaN well layer or InAlGaN well layer.

6. The nitride semiconductor laser device according to claim 1, wherein the nitride semiconductor laser device structure is formed on a substrate selected from the group consisting of a GaN substrate, monocrystalline GaN substrate, sapphire substrate, spinel substrate, ZnO substrate, SiC substrate, ELOG-type substrate and the substrate provided with a nitride semiconductor having a concavo-convex face.

7. The nitride semiconductor laser device according to claim 6, wherein the nitride semiconductor laser device structure is formed on a C-plane, A-plane or M-plane of the monocrystalline GaN substrate.

8. A nitride semiconductor laser device, provided with a window layer on a light-emitting end face of a resonator which comprises an active layer of a nitride semiconductor between n-type nitride semiconductor layers and p-type nitride semiconductor layers, wherein:

at least a radiation-emitting end face of said resonator is covered by said window layer comprising monocrystalline nitride of general formula $Al_xGa_{1-x-y}In_yN$, where $0 \leq x+y \leq 1$, $0 \leq x \leq 1$ and $0 \leq y < 1$, having a wider energy gap than that of the active layer and being formed at a low temperature so as not to damage said active layer, and wherein the nitride semiconductor laser device structure is formed on a C-plane of a monocrystalline CaN substrate and the resonator end face window layer is grown on an M-plane or A-plane.

9. A nitride semiconductor laser device, provided with a window layer on a light-emitting end face of a resonator which comprises an active layer of a nitride semiconductor between n-type nitride semiconductor layers and p-type nitride semiconductor layers, wherein:

at least a radiation-emitting end face of said resonator is covered by said window layer comprising monocrystalline nitride of general formula $Al_xGa_{1-x-y}In_yN$, where $0 \leq x+y \leq 1$, $0 \leq x \leq 1$ and $0 \leq y < 1$, having a wider energy gap than that of the active layer and being formed at a low temperature so as not to damage said active layer, and wherein the nitride semiconductor laser device structure is formed on an A-plane of a monocrystalline GaN substrate, and the window layer is formed on a C-plane or M-plane of a resonator radiation-emitting end face.

10. A nitride semiconductor laser device, provided with a window layer on a light-emitting end face of a resonator which comprises an active layer of a nitride semiconductor between n-type nitride semiconductor layers and p-type nitride semiconductor layers, wherein:

at least a radiation-emitting end face of said resonator is covered by said window layer comprising monocrystalline nitride of general formula $Al_xGa_{1-x-y}In_yN$, where $0 \leq x+y \leq 1$, $0 \leq x \leq 1$ and $0 \leq y < 1$, having a wider energy gap than that of the active layer and being formed at a low temperature so as not to damage said active layer, and wherein the nitride semiconductor laser device structure is formed on an M-plane of a monocrystalline GaN substrate, and the window layer is formed on a C-plane or A-plane of a resonator radiation-emitting end face.

* * * * *